(12) United States Patent
Lin et al.

(10) Patent No.: US 6,621,673 B2
(45) Date of Patent: Sep. 16, 2003

(54) TWO-STAGE ESD PROTECTION CIRCUIT WITH A SECONDARY ESD PROTECTION CIRCUIT HAVING A QUICKER TRIGGER-ON RATE

(75) Inventors: Geeng-Lih Lin, Hsinchu Hsien (TW); Ming-Dou Ker, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/903,693

(22) Filed: Jul. 13, 2001

(65) Prior Publication Data

US 2002/0153570 A1 Oct. 24, 2002

(30) Foreign Application Priority Data

Apr. 24, 2001 (TW) ........................................ 90109806 A

(51) Int. Cl.[7] .................................................. H02H 9/04
(52) U.S. Cl. ......................................... 361/56; 361/111
(58) Field of Search .......................... 361/111, 56, 54; 257/355; 327/310

(56) References Cited

U.S. PATENT DOCUMENTS

| 5,528,188 | A | * | 6/1996 | Au et al. ..................... 327/310 |
| 5,565,790 | A | * | 10/1996 | Lee ............................. 257/360 |
| 6,125,021 | A | * | 9/2000 | Duvvury et al. ............... 361/56 |
| 6,275,089 | B1 | * | 8/2001 | Song et al. ................... 327/314 |

\* cited by examiner

*Primary Examiner*—Kim Huynh
(74) *Attorney, Agent, or Firm*—Intellectual Property Solutions, Incorporated

(57) ABSTRACT

A two-stage ESD protection circuit coupled between an I/O pad and a power rail is provided in the present invention. The two-stage ESD protection circuit has a primary ESD protection circuit and a secondary ESD circuit. The trigger-on rate of the secondary ESD protection circuit is sped up by employing an ESD detection circuit coupled to the I/O pad. It can be further sped up by employing a native NMOS in the secondary ESD protection. According to the invention, the trigger-on speed of the secondary ESD protection circuit can be effectively improved to obtain better ESD protection for the thinner gate oxides of internal circuits in sub-quarter-micron CMOS process.

15 Claims, 3 Drawing Sheets

TWO-STAGE ESD PROTECTION CIRCUIT WITH A SECONDARY ESD PROTECTION CIRCUIT HAVING A QUICKER TRIGGER-ON RATE

BACKGROUND OF THE INVENTION

1. Field of the Invention

The present invention relates to an electrostatic discharge (ESD) protection circuit. In particular, the present invention relates to speeding up the trigger-on rate of a secondary ESD protection circuit in a two-stage ESD protection system.

2. Description of the Related Art

As the semiconductor manufacturing process develops, ESD protection has become one of the most critical reliability issues for integrated circuits (IC). In particular, as semiconductor process advances into the deep sub-micron era, scaled-down devices, thinner gate oxides, lightly-doped drain regions (LDD), shallow trench isolation (STI) process and the metallic salicide process are more vulnerable in terms of ESD stress. Therefore, an efficient ESD protection circuit must be designed and placed on the I/O pad to clamp the overstress voltage across the gate oxide in the internal circuit.

FIG. 1A shows a conventional two-stage ESD protection circuit in an integrated circuit (IC). In FIG. 1A, the field oxide device NF, which utilizes a field oxide segment as a gate oxide and has a higher ESD robustness, acts as a primary ESD protection circuit. NF is positioned near the I/O pad 12 and directly coupled between the I/O pad 12 and VSS, serving to conduct most of the ESD current from the I/O pad 12 to VSS. Nevertheless, the trigger-on voltage of NF during an ESD event is still too high, and the internal circuit 10 of the IC may suffer damage from ESD current during an ESD event. Therefore, a secondary ESD protection circuit between the internal circuit 10 and VSS, incorporated with a buffering resistor RL, clamps voltage received by the internal circuit 10, as shown in FIG. 1A. The secondary ESD protection circuit conventionally consists of a gate-grounded NMOS, such as the NMOS N2 in FIG. 1A. When a positive ESD stress pulses at the I/O pad 12 and VSS is grounded, N2 will initially be triggered on to clamp the voltage at node 14 due to its lower trigger-on voltage. NF, which has a higher trigger-on voltage, will trigger on later to drain most of the ESD charge out of the I/O pad 12 while the voltage at node 16 is higher to a certain level. N2 responds by clamping voltage and draining out smaller ESD current, and, therefore, the silicon area for N2 can be much smaller than that for NF.

As the semiconductor manufacturing process develops, STI process becomes dominant to replace LOCOS (local oxidation) process in CMOS (complementary metal oxide semiconductor) process flow. Unlike the field oxide device built by LOCOS process, the field oxide device built by STI process has a much lower trigger-on rate. If NF in FIG. 1A is formed by STI process, its response is so slow that risks the internal circuit 10 to ESD damage. Therefore, the NF in FIG. 1A becomes unsuitable as semiconductor process advances into the deep sub-micron era.

A known design for a two-stage ESD protection circuit is to apply NMOS with the same threshold voltage to construct the primary ESD protection circuit and the secondary ESD protection circuit, such as the gate-grounded NMOS N1 and N2 in FIG. 1B. In order to achieve the object of the secondary ESD protection circuit triggering prior to the primary ESD protection circuit, the channel length of N2 is designed to be shorter than that of N1. Nevertheless, the difference of trigger-on rate built by varying the channel length of an NMOS is very limited. In other words, although N1 and N2 have different channel lengths, during an ESD event, N2 can't be distinctly triggered on prior to N1. Therefore, the efficiency of a two-stage ESD protection circuit is lost and the ESD protection circuit as shown in FIG. 1B may have a lower ESD robustness.

SUMMARY OF THE INVENTION

An object of the present invention is to provide an ESD design concept, which increases the trigger-on rate of a secondary ESD protection circuit and is especially suitable to ICs fabricated by STI process.

The two-stage electrostatic discharge (ESD) protection circuit of the present invention is suitable for an input/output (I/O) port and is coupled across a pad and a power rail. The two-stage ESD protection circuit comprises a primary ESD protection circuit, an ESD detection circuit, a resistor and a secondary ESD protection circuit. The primary ESD protection circuit is coupled between the pad and the power rail. The ESD detection circuit is also coupled between the pad and the power rail. The resistor is connected in series between the pad and an internal circuit. The secondary ESD protection circuit is coupled between the internal circuit and the power rail. At the beginning of an ESD event, the ESD detection circuit provides a trigger voltage to trigger on the secondary ESD protection circuit prior to the trigger-on of the primary ESD protection circuit, thereby clamping voltage received by the internal circuit.

Another two-stage ESD protection circuit suitable to an input/output (I/O) port according to the present invention is provided. The two-stage ESD protection circuit is coupled across a pad and a power rail, and comprises a primary ESD protection circuit, a resistor and a secondary ESD protection circuit. The primary ESD protection circuit is coupled between the pad and the power rail, comprising a general NMOS with a first threshold voltage. The resistor is connected in series between the pad and an internal circuit. The secondary ESD protection circuit is coupled between the internal circuit and the power rail, comprising a native NMOS with a second threshold voltage lower than the first threshold voltage. At the beginning of an ESD event, the native NMOS in the secondary ESD protection circuit is triggered on prior to the trigger-on of the general NMOS in the primary ESD protection circuit, thereby clamping voltage received by the internal circuit.

By utilizing the ESD detection circuit or the native NMOS, the difficulty of the prior art in separating the trigger-on times of the primary ESD protection circuit and the secondary ESD protection circuit can be overcome, and a two-stage ESD protection circuit with improved ESD robustness is obtained.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 2A:
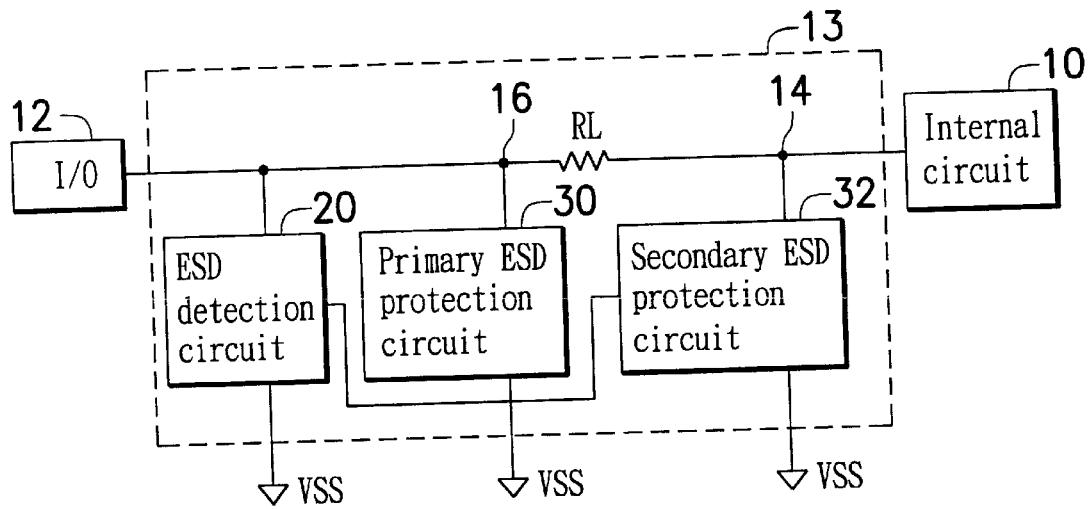
FIG. 2A depicts a concept of a two-stage ESD protection circuit according to the present invention.

FIG. 2A depicts a concept of a two-stage ESD protection circuit according to the present invention. The two-stage ESD protection circuit 13 according to the present invention is suitable to an I/O port and is coupled between an I/O pad 12 and an internal circuit 10. The two-stage ESD protection circuit 13 has a primary ESD protection circuit 30 and a secondary ESD protection circuit 32: the primary ESD protection circuit 30 is coupled between the I/O pad 12 and VSS; the secondary ESD protection circuit 32 is coupled between the internal circuit 10 and VSS. A buffering resistor RL is connected in series between the I/O pad 12 and the internal circuit 10. Furthermore, the two-stage ESD protection circuit 13 has an ESD detection circuit 20 shunt with the primary ESD protection circuit 30. When the ESD detection circuit 20 detects the occurrence of an ESD event on the I/O pad 12, it sends out a trigger voltage to turn on the secondary ESD protection circuit 32 such that the voltage at node 14 is clamped to protect the internal circuit 10.

Figure 2B:
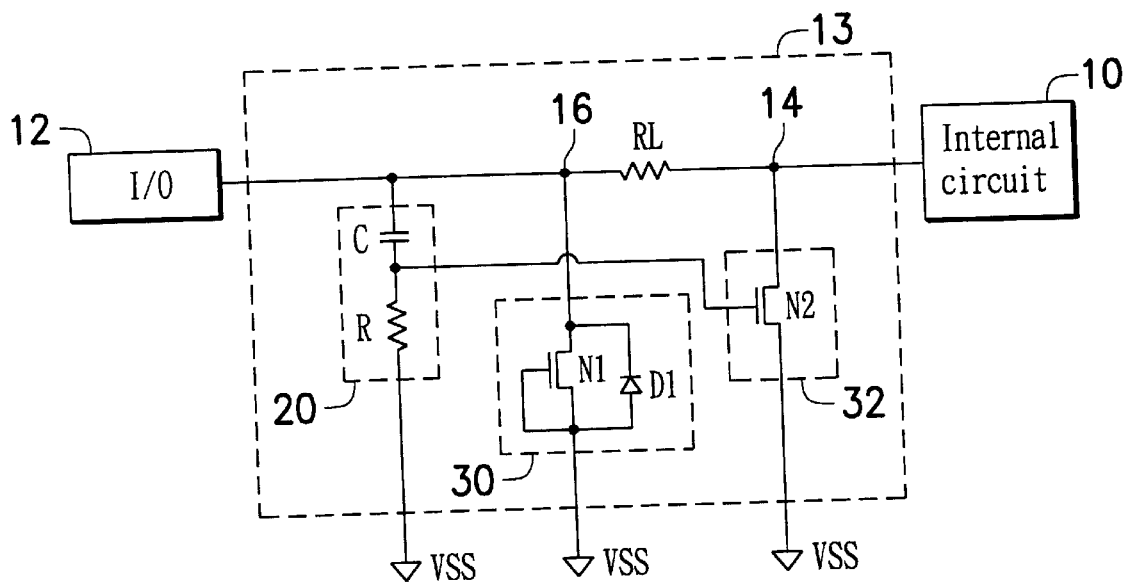
FIG. 2B depicts an embodiment of the two-stage ESD protection circuit in FIG. 2A.

FIG. 2B depicts an embodiment of the two-stage ESD protection circuit in FIG. 2A. The primary ESD protection circuit 30 mainly consists of a gate-grounded NMOS N1, whose drain and source are coupled to node 16 and VSS respectively. The secondary ESD protection circuit 32 mainly consists of an NMOS N2, whose drain and source are coupled to node 14 and VSS respectively. An RC coupling circuit, having a capacitor C and a resistor R connected in series between the I/O pad 12 and VSS, constructs the ESD detection circuit 20. To distinguish an ESD event from normal circuit operation, the R and C value of the ESD detection circuit should be correctly designed.

During normal operation, the coupling voltage to the gate of N2 provided by the capacitor C can be designed smaller than the threshold voltage (Vth) of N2 device, when an input voltage is applied to the I/O pad. Therefore, N2, which has a gate coupled to VSS via resistor R, is remained off. The gate-grounded NMOS N1 is turned off, too. The I/O pad 12 can be coupled to the internal circuit 10 via the buffering resistor RL to transmit signals as an I/O port.

When a negative ESD stress pulses at the I/O pad 12 and VSS is grounded, the parasitic diode D1 at the source of N1 is forward biased to release the ESD stress and protect the internal circuit 10.

When a positive ESD stress pulses at the I/O pad 12 and VSS is ground, due to the coupling effect of capacitor C in the ESD detection circuit 20, the gate of N2 will temporarily be raised to a relatively-high voltage higher than its threshold voltage. Experiments indicate that the NMOS with proper positive gate bias will enhance its ESD protection mechanism (or snapback) more quickly than the NMOS with zero gate bias. Therefore, N2, whose gate is positively biased, will be triggered on much earlier than N1, whose gate is grounded. By properly adjusting the separation between the trigger-on rates of N1 and N2, the voltage at node 14 is clamped by N2 and most of the ESD current is drained out by N1, thereby preventing ESD stress from damaging the internal circuit 10.

N1 and N2 can have the same structure as the NMOS used in the internal circuit 10. In other words, all the elements in FIG. 2B are compatible to conventional or advanced semiconductor process. No modification in semiconductor process is needed to implement the two-stage ESD protection circuit of the present invention.

Furthermore, advanced semiconductor process usually has a lithograph operation and a NMOS Vt (threshold voltage) implantation to adjust the threshold voltages of some NMOS in IC. Generally speaking, NMOS Vt implantation utilizes positive conductivity type (P-type) dopant to raise the Vt of some NMOS. Therefore, an IC might have two kinds of NMOS. These two kinds of NMOS have the same structure (or cross-sectional view) but different Vt. The NMOS not implanted during the NMOS Vt implantation has a lower Vt, which usually depends upon the dopant concentration of the P-well or P-substrate thereunder, and is referred as a native NMOS. The NMOS implanted during the NMOS Vt implantation and having a higher Vt is referred to as a general NMOS. The same concept can be also applied to PMOS. A native PMOS has the same structure (or cross-sectional view) as a general PMOS. Nevertheless, a native PMOS has a less negative threshold voltage than a general PMOS.

Figure 3A:
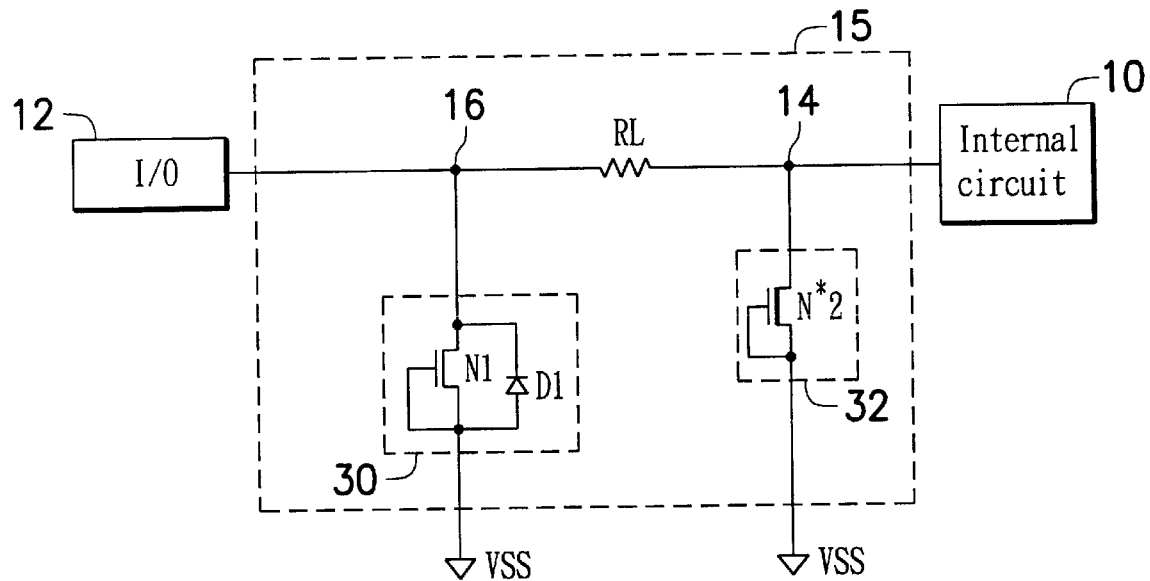
FIG. 3A depicts another embodiment of the two-stage ESD protection circuit according to the present invention.

FIG. 3A depicts another embodiment of the two-stage ESD protection circuit according to the present invention. The two-stage ESD protection circuit 15 has a buffering resistor RL, a primary ESD protection circuit 30 and a secondary ESD circuit 32. The primary ESD protection circuit 30 consists of a gate-grounded NMOS N1, a general NMOS, coupled between node 16 and VSS. The secondary ESD protection circuit 32 consists of a native NMOS N*2 coupling between node 14 and VSS. In FIG. 3A, a native NMOS is symbolized by the same symbol as a general NMOS except having a bolder channel under the gate as that for N*2. Due to the Vt difference, N*2, a native NMOS, is triggered on much earlier than N1, a general NMOS. Utilizing native NMOS, the trigger-on rate of the secondary ESD protection circuit 32 is effectively increased, thus the ESD protection circuit 15 has a robust ESD tolerance level.

Figure 3B:
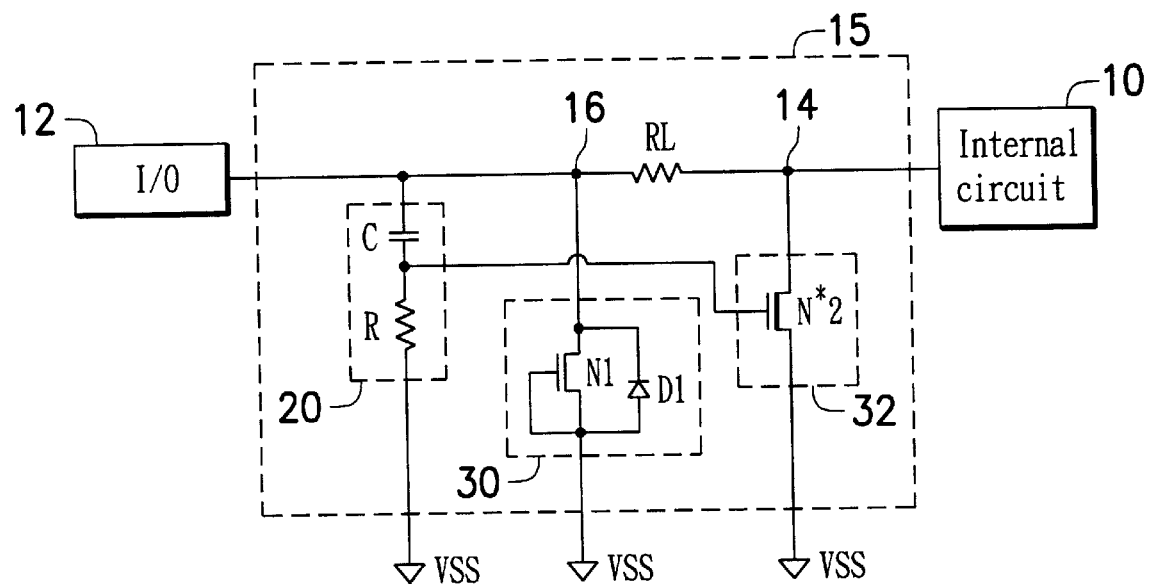
FIG. 3B depicts a two-stage ESD protection circuit with a combination of a native NMOS and an ESD detection circuit to increase the trigger-on rate.

A combination of a native NMOS and an ESD detection circuit to increase the trigger-on rate is depicted in FIG. 3B. In FIG. 3B, ESD detection circuit 20 consists of an RC coupling circuit with a resistor R and a capacitor C connected in series. As mentioned before, when the positive ESD stress pulses at the I/O pad 12 and VSS is grounded, the RC coupling circuit temporarily raises the voltage at the gate of the native NMOS N*2 and further speeds up the trigger-on rate of N*2.

Employing the ESD protection circuit 20 or native NMOS, the trigger-on rate of the secondary ESD protection circuit can be increased, such that the overall ESD protection circuit has better ESD robustness.

Figure 1A:
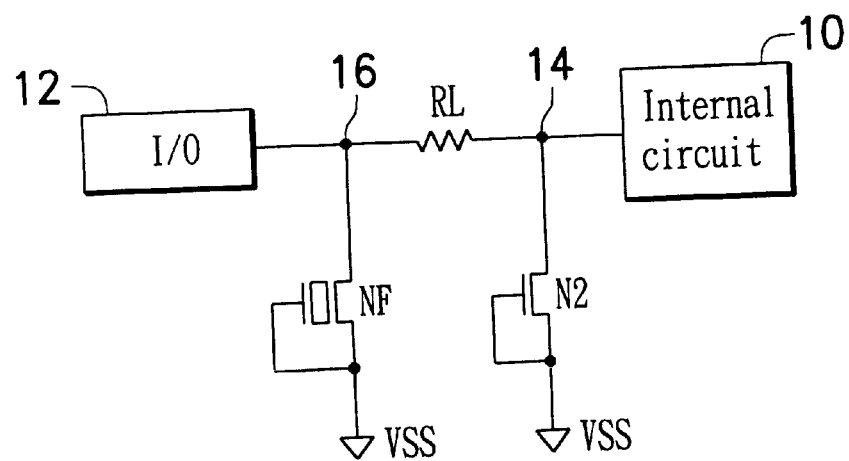
FIG. 1A shows a conventional two-stage ESD protection circuit in an integrated circuit (IC)
Figure 1B:
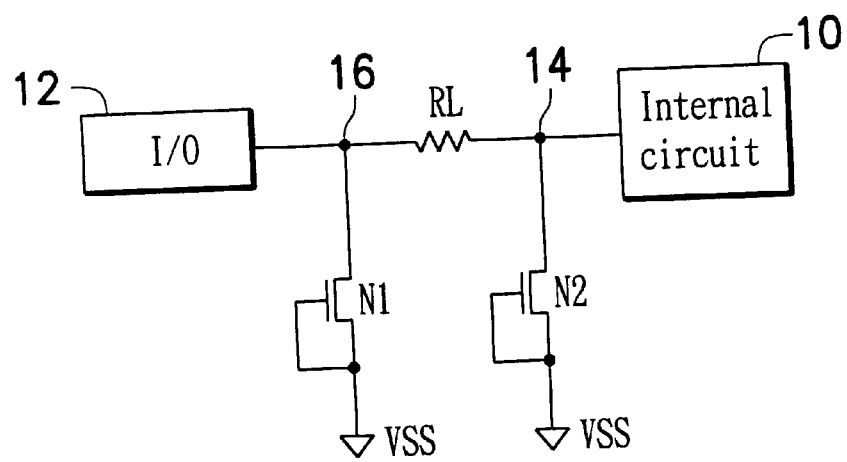
FIG. 1B depicts another two-stage ESD protection circuit with NMOS of the same threshold voltage.

The conventional ESD protection circuit in FIG. 1B has a disadvantage of difficulty in separating the trigger-on times of the primary ESD protection circuit and the secondary ESD protection circuit. By contrast, the trigger-on rate for the secondary ESD protection circuit is easily adjusted or increased by employing native NMOS and the ESD detection circuit. Therefore, the primary ESD protection circuit and the secondary ESD circuit can separately triggered on during an ESD event, thereby improving the ESD protection performance of a two-stage ESD protection circuit.

The embodiments described above utilize general NMOS and native NMOS. According to the same concept, general PMOS and native PMOS can also be utilized to improve the trigger-on rate of a secondary ESD protection circuit. The interchange skill between P-type and N-type as well as that between VDD and VSS is familiar to those in the art. Therefore, the embodiments with general PMOS and native PMOS will be familiar to those in the art after reading this specification and are, thus, not repeated here.

Finally, while the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A two-stage electrostatic discharge (ESD) protection circuit, suitable to an input/output (I/O) port, coupled across a pad and a power rail, comprising:
   a primary ESD protection circuit, coupled between the pad and the power rail;
   an ESD detection circuit, coupled between the pad and the power rail;
   a resistor, connected in series between the pad and a internal circuit, wherein the ESD detection circuit is coupled to the internal circuit through the resistor; and
   a secondary ESD protection circuit, coupled between the internal circuit and the power rail;
   wherein, at the beginning of an ESD event, the ESD detection circuit provide a trigger voltage to trigger on the secondary ESD protection circuit prior to the activation of the primary ESD protection circuit, thereby clamping voltage received by the internal circuit.

2. The two-stage ESD protection circuit as claimed in claim 1, wherein the primary ESD protection circuit and the secondary ESD protection circuit both comprise at least one NMOS (N-type Metal Oxide Semiconductor Transistor).

3. The two-stage ESD protection circuit as claimed in claim 1, wherein the primary ESD protection circuit comprises a first NMOS having a gate coupled to the power rail.

4. The two-stage ESD protection circuit as claimed in claim 1, wherein the secondary ESD protection circuit comprises a second NMOS having a gate for receiving the trigger voltage.

5. The two-stage ESD protection circuit as claimed in claim 4, wherein the primary ESD protection circuit comprises a first NMOS having a gate coupled to the power rail, and the first NMOS substantially has the same threshold voltage as the second NMOS.

6. The two-stage ESD protection circuit as claimed in claim 4, wherein the primary ESD protection circuit comprises a first NMOS having a gate coupled to the power rail, and the first NMOS has a threshold voltage higher than the second NMOS.

7. The two-stage ESD protection circuit as claimed in claim 4, wherein the second NMOS is a native NMOS.

8. The two-stage ESD protection circuit as claimed in claim 1, wherein the ESD detection circuit comprises an RC-coupling circuit to differentiate between ESD stress and normal circuit operation.

9. The two-stage ESD protection circuit as claimed in claim 1, wherein the power rail is a VSS power rail.

10. The two-stage ESD protection circuit as claimed in claim 1, wherein the power rail is a VDD power rail.

11. A two-stage ESD protection circuit, suitable to an input/output (I/O) port, coupled across a pad and a power rail, comprising:
    a primary ESD protection circuit, coupled between the pad and the power rail, comprising a general NMOS with a first threshold voltage;
    a resistor, connected in series between the pad and an internal circuit, wherein the ESD detection circuit is coupled to the internal circuit through the resistor; and
    a secondary ESD protection circuit, coupled between the internal circuit and the power rail and comprising a native NMOS with a second threshold voltage lower than the first threshold voltage;
    wherein, at the beginning of an ESD even, the native NMOS in the secondary ESD protection circuit, thereby clamping voltage received by the internal circuit.

12. The ESD protection circuit as claimed in claim 11, wherein the general NMOS has a gate and a source both coupled to the power rail, and a drain coupled to the pad.

13. The ESD protection circuit as claimed in claim 11, wherein the native NMOS has a gate and a source both coupled to the power rail, and a drain coupled to the pad.

14. The ESD protection circuit as claimed in claim 11, further comprising an ESD detection circuit coupled between the pad and the power rail for detecting the ESD event to trigger on the native NMOS in the secondary ESD protection circuit.

15. The two-stage ESD protection circuit as claimed in claim 14, wherein the ESD detection circuit comprises an RC-coupling circuit to differentiate between ESD stress and normal circuit operation.

* * * * *